(12) United States Patent
Balakrishnan et al.

(10) Patent No.: US 10,170,464 B2
(45) Date of Patent: Jan. 1, 2019

(54) COMPOUND SEMICONDUCTOR DEVICES HAVING BURIED RESISTORS FORMED IN BUFFER LAYER

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/732,174

(22) Filed: Jun. 5, 2015

(65) Prior Publication Data

US 2016/0358905 A1    Dec. 8, 2016

(51) Int. Cl.
*H01L 27/06*     (2006.01)
*H01L 49/02*     (2006.01)
*H01L 21/8234*   (2006.01)
*H01L 21/8252*   (2006.01)

(52) U.S. Cl.
CPC ...... *H01L 27/0629* (2013.01); *H01L 21/8252* (2013.01); *H01L 27/0605* (2013.01); *H01L 28/20* (2013.01)

(58) Field of Classification Search
CPC .... H01L 21/8234; H01L 27/629; H01L 28/20
See application file for complete search history.

(56) References Cited

U.S. PATENT DOCUMENTS

| | | | |
|---|---|---|---|
| 4,228,450 A | * | 10/1980 | Anantha ............... H01L 21/743 257/540 |
| 5,818,073 A | | 10/1998 | Ochi et al. |
| 7,084,483 B2 | | 8/2006 | Aitken et al. |
| 7,375,000 B2 | | 5/2008 | Nowak et al. |
| 7,772,649 B2 | | 8/2010 | Cheng et al. |
| 8,110,862 B2 | | 2/2012 | Cheng et al. |
| 8,865,542 B2 | | 10/2014 | Lim et al. |

(Continued)

FOREIGN PATENT DOCUMENTS

| | | |
|---|---|---|
| JP | 61290790 A | 12/1986 |
| JP | 7263774 A | 10/1995 |

*Primary Examiner* — Fernando L Toledo
*Assistant Examiner* — Lawrence-Linh T Nguyen
(74) *Attorney, Agent, or Firm* — L. Jeffrey Kelly; Ryan, Mason & Lewis, LLP (57) ABSTRACT

Structures and methods are provided for fabricating a semiconductor device (e.g., III-V compound semiconductor device) having buried resistors formed within a buffer layer of the semiconductor device. For instance, a semiconductor device includes a buffer layer disposed on a substrate, a channel layer disposed on the buffer layer, and a buried resistor disposed within the buffer layer. The buffer and channel layers may be formed of compound semiconductor materials such as III-V compound semiconductor materials. Utilizing the buffer layer of a compound semiconductor structure to form buried resistors provides a space-efficient design with increased integration density since the resistors do not have to occupy a large amount of space on the active surface of a semiconductor integrated circuit chip.

14 Claims, 9 Drawing Sheets

(56) References Cited

U.S. PATENT DOCUMENTS

| | | | |
|---|---|---|---|
| 2002/0171077 A1* | 11/2002 | Chu | B82Y 20/00 |
| | | | 257/19 |
| 2005/0194619 A1* | 9/2005 | Edelstein | H01L 31/103 |
| | | | 257/232 |
| 2007/0194390 A1* | 8/2007 | Chinthakindi | H01L 27/0802 |
| | | | 257/379 |
| 2009/0173980 A1* | 7/2009 | Cheng | H01L 27/1087 |
| | | | 257/301 |
| 2011/0140176 A1* | 6/2011 | Briere | H01L 21/8252 |
| | | | 257/200 |
| 2014/0035001 A1 | 2/2014 | Czornomaz et al. | |
| 2015/0008531 A1 | 1/2015 | Lim et al. | |

* cited by examiner

COMPOUND SEMICONDUCTOR DEVICES HAVING BURIED RESISTORS FORMED IN BUFFER LAYER

TECHNICAL FIELD

This disclosure relates generally to semiconductor fabrication techniques and, in particular, to structures and methods for fabricating compound semiconductor devices.

BACKGROUND

While advances in silicon (Si) technology continue to revolutionize the development of micro and nano electronics, the semiconductor industry is also conducting significant research in the heterogeneous integration of compound semiconductors with Si substrates for the development of high-speed electronic and optoelectronic devices. For example, one class of compound semiconductors referred to as "III-V compound semiconductors" include at least one element from each of Group III and Group V of the periodic table of elements. Examples of III-V compound semiconductors include, but are not limited to, GaAs (Gallium Arsenide), InP (Indium Phosphide), InGaAs (Indium Gallium Arsenide), InAs (Indium Arsenide), GaP (Gallium Phosphide), InSb (Indium Antimonide), GaSb (Gallium Antimonide), GaN (Gallium Nitride), and AlInP (Aluminum Indium Phosphide). The ability to efficiently implement passive components such as resistors using CMOS (complementary metal-oxide-semiconductor) technologies will be essential if compound semiconductor technologies are to be effectively utilized as a replacement for silicon CMOS device fabrication. Typically, front-end-of-the-line resistors are fabricated in the active compound semiconductor material layer (e.g., III-V active layer) or the gate material layer (e.g. doped polysilicon). However, the layout of a resistor can be relatively large and, therefore, detract from the area that is used for constructing other components such as FETs (field effect transistors).

SUMMARY

One embodiment of the invention includes a method for fabricating a semiconductor device. The method includes forming a buffer layer on a substrate, forming a channel layer on the buffer layer, and forming a buried resistor within the buffer layer. Another embodiment of the invention includes a semiconductor device having a buried resistor. The semiconductor device includes a buffer layer disposed on a substrate, a channel layer disposed on the buffer layer, and a buried resistor disposed within the buffer layer. In one embodiment, the buffer and channel layers are formed of compound semiconductor materials such as III-V compound semiconductor materials. These and other embodiments will be described in the following detailed description of embodiments, which is to be read in conjunction with the accompanying figures.

BRIEF DESCRIPTION OF THE DRAWINGS

FIGS. 1A and 1B schematically illustrate a semiconductor structure having a buried resistor formed in a buffer layer according to an embodiment of the invention, wherein

FIGS. 2A and 2B schematically illustrate a semiconductor structure having a buried resistor formed in a buffer layer according to another embodiment of the invention, wherein

FIGS. 3A, 3B, 3C, 3D, 3E, 3F, 3G, 3H, 3I, and 3J schematically illustrate a method for fabricating a semiconductor structure having a buried resistor formed in a buffer layer, according to an embodiment of the invention, wherein:

DETAILED DESCRIPTION OF EMBODIMENTS

Embodiments of the invention will now be described in further detail with regard to structures and methods for fabricating a compound semiconductor device (e.g., III-V compound semiconductor device) having buried resistors formed within a buffer layer of the compound semiconductor device. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the term "about" as used herein with regard to thicknesses, percentages, ranges, etc., is meant to denote being close or approximate to, but not exactly. For example, the term "about" as used herein implies that a small margin of error is present, such as 1% or less than the stated amount.

Figure 1A:
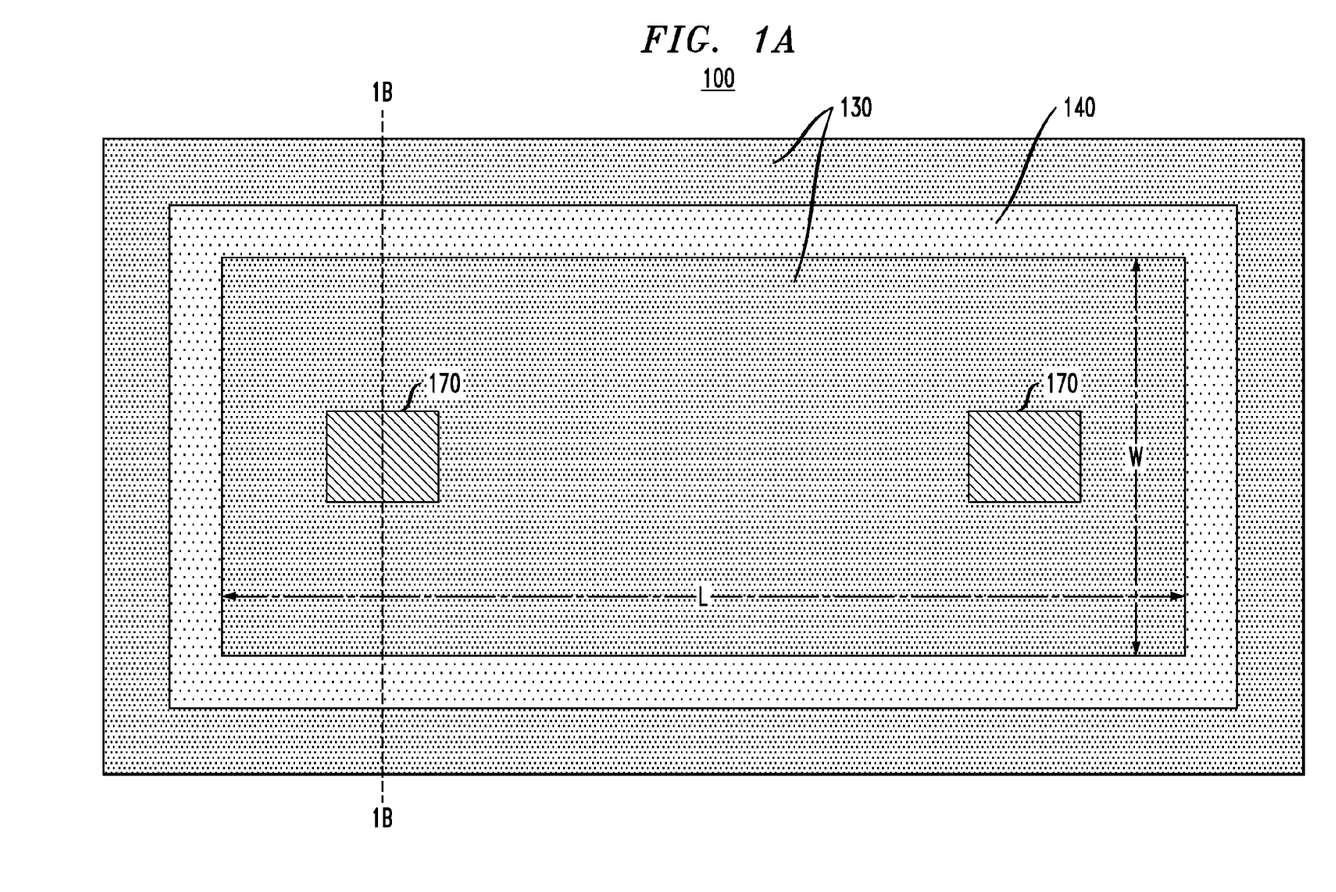
FIG. 1A is a top plan schematic view of the semiconductor structure.
Figure 1B:
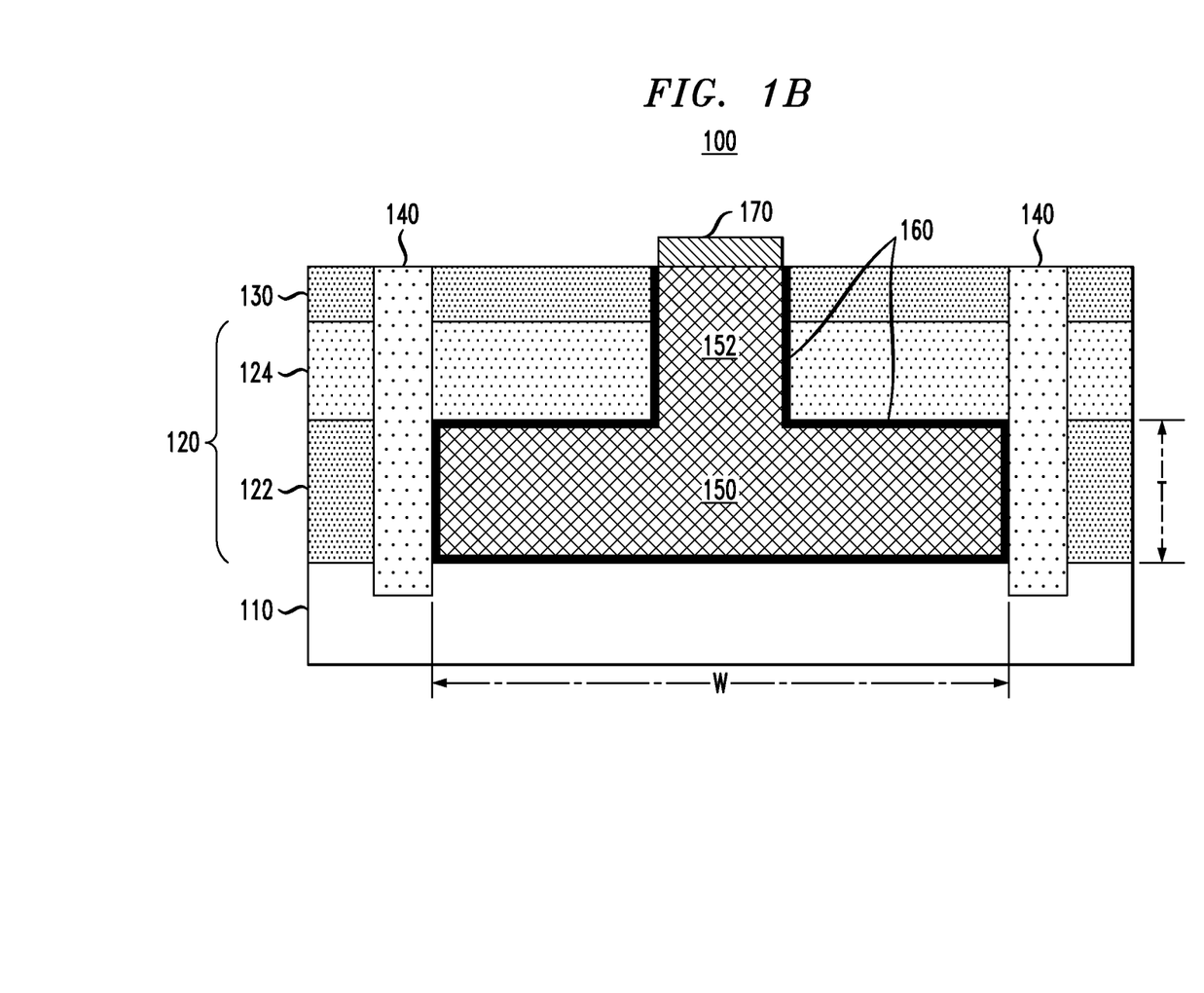
FIG. 1B is a cross-sectional schematic view of the semiconductor structure along line 1B-1B of FIG. 1A.

FIGS. 1A and 1B schematically illustrate a semiconductor structure 100 having a buried resistor formed within a buffer layer, according to an embodiment of the invention. In particular, FIG. 1A is a top plan schematic view of the semiconductor structure 100, and FIG. 1B is a cross-sectional schematic view of the semiconductor structure 100 taken along line 1B-1B of FIG. 1A. Referring collectively to FIGS. 1A and 1B, the semiconductor structure 100 comprises a semiconductor substrate 110, a buffer layer 120, a channel layer 130, a trench isolation structure 140, a buried resistor 150, contact plugs 152, an insulating layer 160, and ohmic contacts 170. In one embodiment, the buffer layer 120 comprises a multilayer buffer structure comprising a first layer 122 and a second layer 124.

In one embodiment, the semiconductor structure 100 comprises a compound semiconductor on silicon structure, wherein the semiconductor substrate 110 comprises silicon, and the buffer layer 120 and channel layer 130 are formed of compound semiconductor materials. The term "compound semiconductor" as used herein denotes a semiconductor compound composed of elements from two or more different groups of the periodic table, or different elements from the same group of the periodic table. For example, in one embodiment, the buffer layer 120 and channel layer 130 may be formed with III-V compound semiconductor materials or other types of compound materials such as II-VI, IV-IV, or IV-VI compound semiconductor materials. By way of specific example, in one embodiment, buffer layer 120 is formed of III-V compound semiconductor materials wherein the first layer 122 comprises a layer of GaAs and the second layer 124 comprises a layer of InP.

Moreover, in one embodiment of the invention, the channel layer 130 is formed of a III-V compound semiconductor material. For example, the channel layer 130 may comprise a layer of InGaAs. The channel layer 130 provides an active device layer in which various type of semiconductor devices, such as FETs (field effect transistors) can be formed. As is known in the art, the use of a compound semiconductor material (such as a III-V compound semiconductor material) provides a higher carrier mobility than silicon and, therefore, allows for the fabrication of high-speed and high-performance semiconductor devices.

The buffer layer 120 comprises a multilayer structure that serves multiple purposes. For example, the buffer layer 120 provides a graded buffer structure that serves to effectively match the lattice constant of the material (e.g., silicon) of the semiconductor substrate 110 to the lattice constant of the material of the channel layer 130. In other words, the buffer layer 120 serves to minimize mechanical strain that would otherwise exist if the compound semiconductor channel layer 130 was formed directly on the semiconductor substrate 110 due to the lattice mismatch between the materials of the semiconductor substrate 110 and the channel layer 130.

In particular, in the embodiment shown in FIG. 1B, the first layer 122 of the buffer layer 120 is formed of a compound material that has a lattice constant which is different from, but closely matched to, the lattice constant of the material of the semiconductor substrate 110. Further, the second layer 124 of buffer layer 120 is formed of a compound material that has a lattice constant which is different from, but closely matched to, the lattice constant of the material forming the first layer 122 of the buffer layer 120, as well as the lattice constant of the material forming the channel layer 130. In this manner, the buffer layer 120 provides a relaxed buffer structure that serves to minimize mechanical stress resulting from the lattice mismatch between the semiconductor substrate 110 and the compound semiconductor channel layer 130.

Furthermore, in accordance with embodiments of the invention, the buffer layer 120 provides a space in which buried resistors (e.g., resistor 150) can be formed, and then connected to other circuit components including compound semiconductor devices, for example, to build integrated circuitry. The buffer space is a unique aspect of compound semiconductor integration, which enables resistors to be formed in the buffer layer 120 below the active channel layer 130 and, thereby, allow for more area/space in the channel layer 130 for constructing active devices such as FETs, for example, and other circuit components.

As explained in further detail below, the buried resistor 150 may be formed by etching a resistor region within the buffer layer 120, lining the exposed surfaces of the buffer layer 120 within the resistor region with an insulating/dielectric material to form the insulating layer 160, and then filling the resistor region within the buffer layer 120 with a semiconductor resistor material having a desired resistivity (e.g., doped silicon) to form the semiconductor resistor 150. In one embodiment of the invention, as shown in FIG. 1B, etching a resistor region within the buffer layer 120 comprises etching recesses (e.g., annular or angular-shaped recesses) through the channel layer 130 and second buffer layer 124 down to the first buffer layer 122, and then selectively etching away a portion of the first buffer layer 122 which is beneath the second buffer layer 124 and within the confines of the trench isolation structure 140.

In this regard, as shown in FIGS. 1A and 1B, the resistor region within the buffer layer 120 is defined primarily by the layout of the trench isolation structure 140 and a thickness of the buffer layer 120. More specifically, as shown in the example embodiment of FIG. 1B, the trench isolation structure 140 is a rectangular-shaped structure that defines a length L and a width W of the resistor region. Furthermore, as shown in FIG. 1A, a thickness of the resistor region is defined by a thickness T of the first buffer layer 122. Based on these dimensions, the resistance of the semiconductor resistor 150 is approximately equal to $\rho L/A$, wherein $\rho$ denotes the resistivity coefficient of the semiconductor material used to form the semiconductor resistor 150, wherein L denotes the length of the resistor region, and wherein A denotes the cross-sectional area A of the resistor region (A=W×T).

As shown in FIG. 1A, ohmic contacts 170 are disposed at opposite ends of the resistor region along the resistor length L. The ohmic contacts 170 may comprise metallic contacts, silicide contacts, or other types of ohmic contacts which allow for low-resistance electrical connections between the semiconductor resistor 150 and other circuit components formed on the active surface of the semiconductor structure 100. In one embodiment of the invention, as shown in FIG. 1A, the ohmic contacts 170 can be angular-shaped (e.g., square or rectangular shaped). In other embodiments, the ohmic contacts 170 can be annular-shaped (e.g., ring-shaped). Each ohmic contact 170 is electrically connected to the semiconductor resistor 150 via a contact plug 152. In one embodiment, the contact plug 152 can be formed of the same material that is used to form the semiconductor resistor 150, in which case the contact plug 152 may contribute some non-negligible amount of resistance in the electrical path between the ohmic contacts 170 and, thus, be considered part of the semiconductor resistor 150. In other embodiments, the contact plug 152 can be formed of other material, such as metallic material, to provide a low-resistance contact plug that contributes some negligible amount of resistance in the electrical path between the ohmic contacts 170 as compared to the resistance of the semiconductor resistor 150.

The insulating layer 160 serves as both an electrical insulating layer and a thermal insulating layer. In particular, the insulating layer 160 serves as a diffusion barrier to prevent dopants, which are included in the material forming the semiconductor resistor 150, from diffusing out of the semiconductor resistor 150 into the surrounding material. Moreover, the insulating layer 160 serves to thermally insulate the semiconductor resistor 150 from the surrounding material and minimize an amount of change in the internal resistance of the semiconductor resistor 150 due to a change in temperature of the resistor material (the rate of resistance change based on temperature is referred to as the "Temperature Coefficient of Resistance"). Thus, the insulating layer 160 serves to improve the precision of the semiconductor resistor 150 by enabling the semiconductor resistor 150 to maintain a relatively constant resistance over time (e.g., maintain doping over time) and over a wide range of different thermal conditions.

As noted above, the buffer layer 120 provides a space in which the semiconductor resistor 150 can be formed below the active channel layer 130, while being connected to other circuit components formed in or on the active channel layer 130. Indeed, since the semiconductor resistor 150 is disposed below the active device region, the semiconductor resistor 150 does not occupy any significant real estate of the active device region. The only real estate of the active device region which is used for implementing the semiconductor resistor 150 is the area that is needed to form the trench isolation structure 140 and the ohmic contacts 170. For example, referring to FIG. 1A, various circuit components such as FETs can be formed in the region of the active channel layer 130 which is located within the confines of the trench isolation structure 140 between the ohmic contacts 170, above the semiconductor resistor 150. This is to be contrasted with conventional polyresistor structures that are formed as part of a gate material layer or active resistor structures that are formed as part of the active channel material layer, which can occupy a relatively large amount of real estate in the active device region.

Figure 2A:
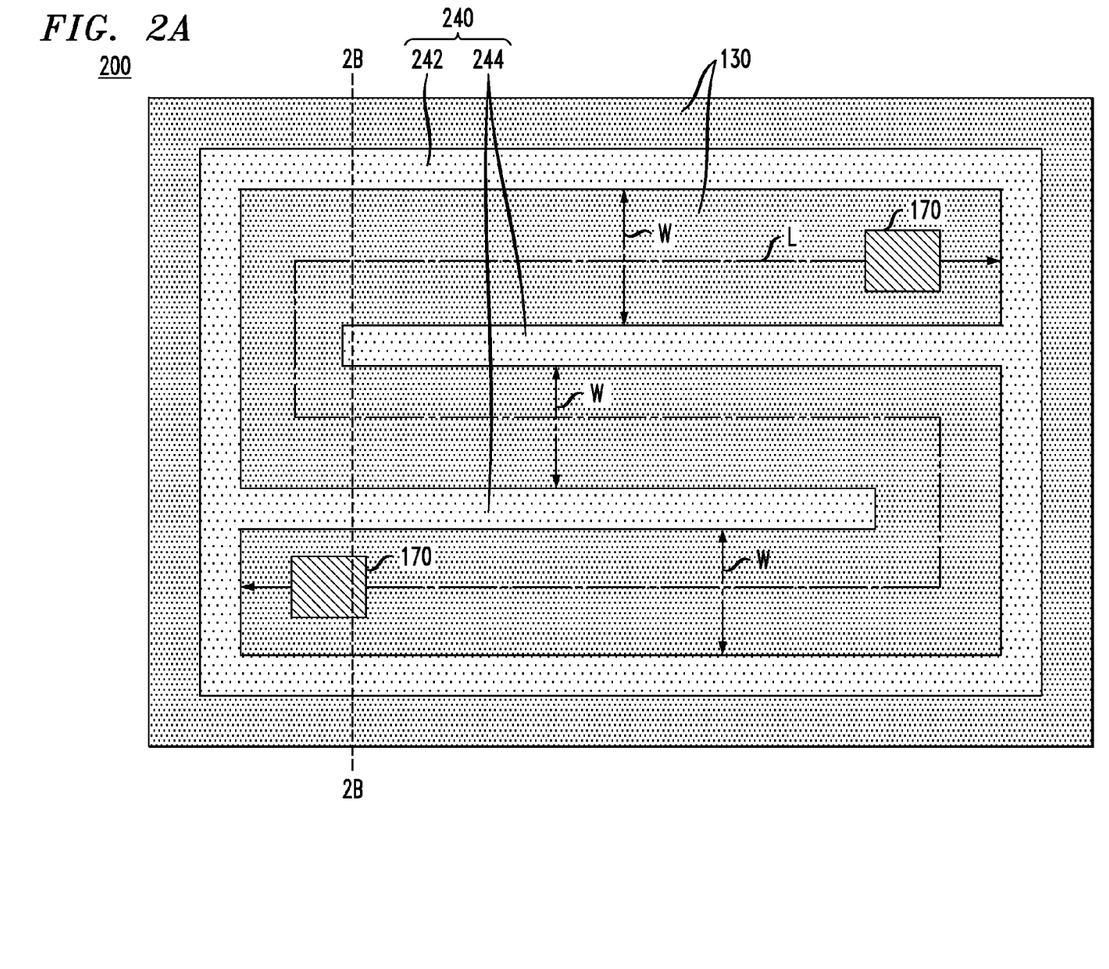
FIG. 2A is a top plan schematic view of the semiconductor structure.
Figure 2B:
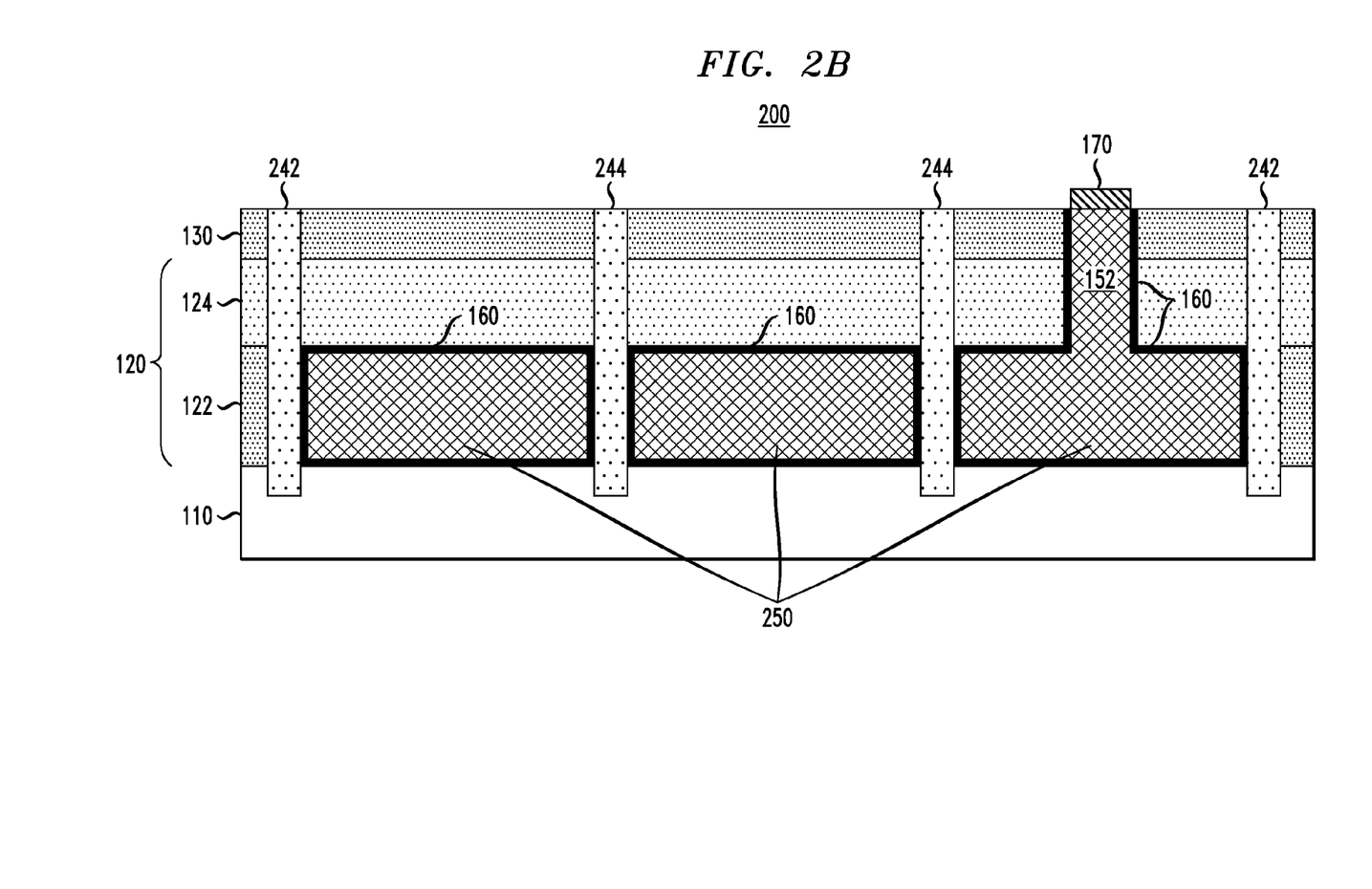
FIG. 2B is a cross-sectional schematic view of the semiconductor structure along line 2B-2B of FIG. 2A.

FIGS. 2A and 2B schematically illustrate a semiconductor structure 200 having a buried resistor formed in a buffer layer, according to another embodiment of the invention. FIG. 2A is a top plan schematic view of the semiconductor structure 200, and FIG. 2B is a cross-sectional schematic view of the semiconductor structure 200 along line 2B-2B of FIG. 2A. The semiconductor structure 200 of FIGS. 2A/2B is similar to the semiconductor structure 100 of FIGS. 1A/1B, except that the semiconductor structure 200 comprises a trench isolation structure 240 that defines a meandering-shaped buried semiconductor resistor 250. In particular, as shown in FIGS. 2A and 2B, the trench isolation structure 240 comprises an outer rectangular-shaped isolation structure 242 and a plurality of alternating elongated isolation structures 244 within the confines of the outer isolation structure 242, which define alternating/meandering paths along a length L of the buried resistor 250 between the contacts 170. As compared to the buried semiconductor resistor 150 shown in FIG. 1A, the meandering-shaped buried semiconductor resistor 250 (defined by the trench isolation structure 240) as shown in FIG. 2A has a longer length L which can provide a higher resistance value. It is to be understood that the buried resistor shapes illustrated in FIGS. 1A/1B and 2A/2B are merely examples, and that various other types of shapes and structures for forming buried resistors in buffer layers can be implemented depending on the given application and target layout.

While the illustrative embodiments in the accompanying figures show a multilayer buffer layer 120 comprising two buffer layers, it is to be understood that in other embodiments of the invention, a buffer layer can be fabricated with three or more buffer layers, depending on the application. Buried resistors can be formed in multilayer buffer structure having three or more buffer layers using the same or similar techniques as described herein.

Figure 3A:
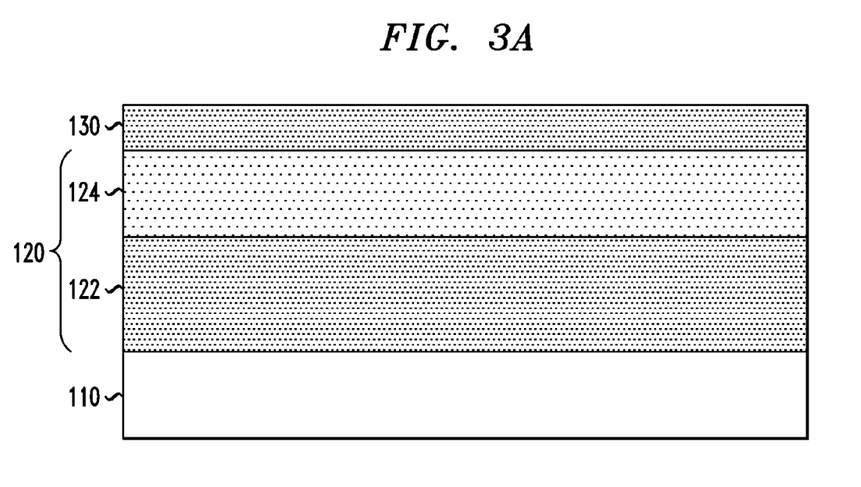
FIG. 3A is a cross-sectional view of the semiconductor structure at an initial stage of fabrication where a stack of compound semiconductor layers including a buffer layer and a channel layer are formed on substrate, according to an embodiment of the invention.

FIGS. 3A, 3B, 3C, 3D, 3E, 3F, 3G, 3H, 3I, and 3J schematically illustrate a method for fabricating a compound semiconductor structure having a buried resistor formed within a buffer layer, according to an embodiment of the invention. More specifically, FIGS. 3A, 3B, 3C, 3D, 3E, 3F, 3G, 3H, 3I, and 3J are cross-sectional schematic views of the semiconductor structure 100 shown in FIG. 1B at various stages of fabrication. Referring initially to FIG. 3A, a cross-sectional view of the semiconductor structure 100 is shown at an initial stage of fabrication where a stack of compound semiconductor layers including the buffer layer 120 and the channel layer 130 are formed on the semiconductor substrate 110, according to an embodiment of the invention.

In one embodiment of the invention, as noted above, the semiconductor substrate 110 may comprise a silicon substrate. In another embodiment, the semiconductor substrate 110 can be an SOI (silicon on insulator) substrate. In other embodiments, the semiconductor substrate 110 may be formed with other types of substrate material, or multiple layers of substrate materials, which are commonly used for semiconductor device fabrication. For example, the semiconductor substrate 110 may include semiconductor materials such as, SiGe, SiGeC, SiC, Ge, Ge alloys, Ga, GaAs, InAs, InP, and other types of III-V compound semiconductors.

Furthermore, as noted above, in one embodiment of the invention, the buffer layer 120 and channel layer 130 may be formed using III-V compound semiconductor materials, for example. The compound semiconductor material layers 122, 124 and 130 are formed, in sequence, using an epitaxial growth process implemented by means of chemical vapor deposition (CVD) or other known epitaxial growth techniques such as, for example, molecular beam epitaxy (MBE) or metal-organic chemical vapor deposition (MOCVD). The deposition of each compound semiconductor layer 122, 124, 130 may be performed in the same deposition chamber, or a different deposition chamber, using suitable precursors, e.g., III/V-containing precursors such as group III elements (e.g., Al, Ga, In) and group V elements (e.g., N, P, As, Sb).

In a multilayer buffer embodiment as shown in FIG. 3A, the compound semiconductor materials that are used for constructing the buffer layer 120 will depend on the semiconductor materials of the substrate 110 and channel layer 130. For example, as noted above, the compound semiconductor materials that are used for the first and second buffer layers 122 and 124 are selected to provide a relaxed buffer structure which serves to minimize mechanical stresses that would otherwise result due to the lattice mismatch between the different materials of the substrate 110 and the channel layer 130. Furthermore, to facilitate the fabrication of buried semiconductor resistors in the buffer layer 120, the compound semiconductor materials of the first and second buffer layers 122 and 124 are preferably chosen so that there is high etch selectivity between the first and second buffer layers 122 and 124. As discussed in further detail below with reference to FIG. 3F, this allows the first buffer layer 122 to be etched selective to the second buffer layer 124 and, thereby, define a resistor region within the buffer layer 120.

In one embodiment of the invention, the buffer layer 120 has a thickness in a range of about 300 nm to about 2 μm. In addition, in one embodiment, the channel layer 130 has a thickness in a range of about 14 nm to about 200 nm. The thickness of the various layers 120 and 130 will vary depending on the application. For example, when fabricating FinFET devices, the thickness of the channel layer 130 may be greater than the thickness of the channel layer 130 needed to construct other types of FETs. Moreover, in a multilayer buffer embodiment such as shown in FIG. 3A, the thickness of the first buffer layer 122 will depend, in part, and the target dimensions of the semiconductor resistor to be formed in the buffer layer 120.

Figure 3B:
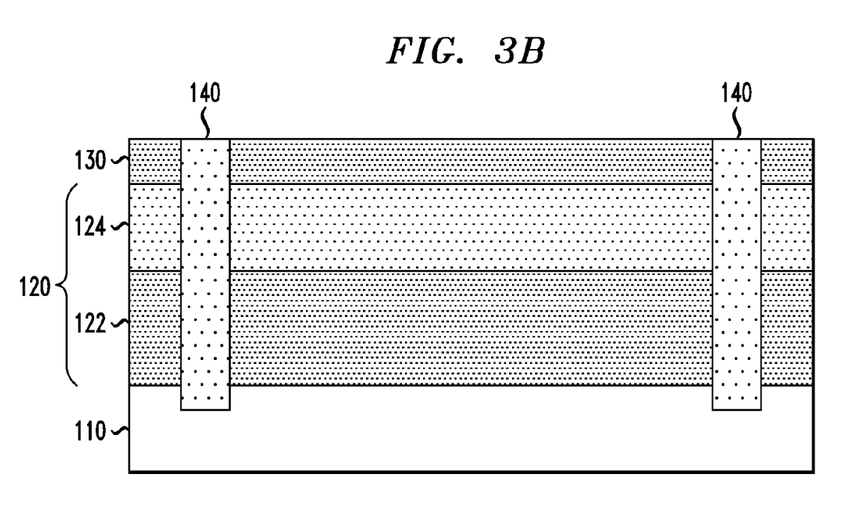
FIG. 3B is a cross-sectional view of the semiconductor structure of FIG. 3A after forming a trench isolation structure to define a resistor region within the buffer layer, according to an embodiment of the invention.

A next step in the fabrication process includes forming trench isolation structures that define resistor regions in the buffer layer 120. For instance, FIG. 3B is a cross-sectional view of the semiconductor structure of FIG. 3A after forming the trench isolation structure 140 within the buffer layer 120, according to an embodiment of the invention. The trench isolation structure 140 can be a shallow trench or deep trench isolation structure that is fabricated using standard techniques. For example, a standard photolithography process is implemented to form a lithographic mask that is used to etch shallow or deep trenches in the semiconductor structure using the lithographic mask. In FIG. 3B, a trench is formed by etching completely through the channel layer 130 and the buffer layer 120, and partially into the semiconductor substrate 110 just below the buffer layer 120. The etch process may be performed by sequentially etching the various layers 130, 124, 122 and 110 using dry plasma etching or using any other anisotropic etch processes and etch environments with etching chemistries that are suitable to etch the semiconductor materials forming the various layers 130, 124, 122 and 110. For example, deep reactive-ion etching (DRIE) is a highly anisotropic etch process that may be implemented to etch deep, steep sided trenches, with high aspect ratios, within the stack of layers 130, 124, 122 and 110.

After the trenches are etched, a next step in the fabrication process includes blanket depositing a trench fill material to fill the trenches with the trench fill material. The trench fill material may be an oxide material, such as silicon dioxide formed using an SACVD or spin coating process, or HDP (high-density plasma) oxide, or other insulating/dielectric materials that are suitable for the given application. After the depositing the blanket layer of trench fill material, the substrate surface is planarized down to the channel layer 130 to remove the portions of the trench fill material on the surface of the channel layer 130, resulting in the structure show in FIG. 3B.

Figure 3C:
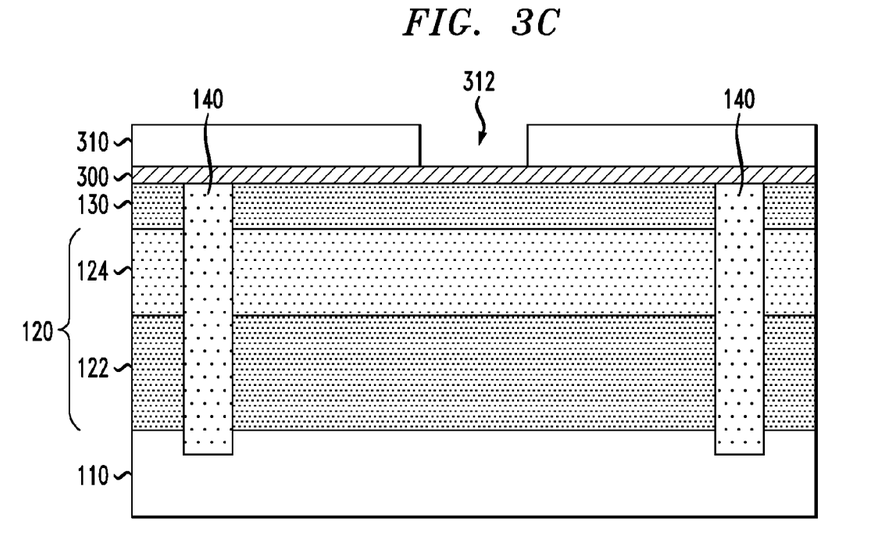
FIG. 3C is a cross-sectional view of the structure of FIG. 3B after depositing a layer of dielectric material and forming a photoresist mask to pattern the layer of dielectric material, according to an embodiment of the invention.

A next step in the fabrication process includes forming an etch mask on the channel layer 130, which is to be used for etching a recess and resistor region within the buffer layer 120. For example, FIG. 3C is a cross-sectional view of the structure of FIG. 3B after depositing a dielectric layer 300 over the channel layer 130 and forming a photoresist mask 310, according to an exemplary embodiment of the invention. In one embodiment of the invention, the dielectric layer 300 is formed of any material (e.g., a nitride material) which is suitable to serve as an etch mask for the given application. A photoresist material is deposited on the dielectric layer 300, and lithographically patterned to form the photoresist mask 310 comprising an opening 312 which is to be transferred to the dielectric layer 300 to form an etch mask.

Figure 3D:
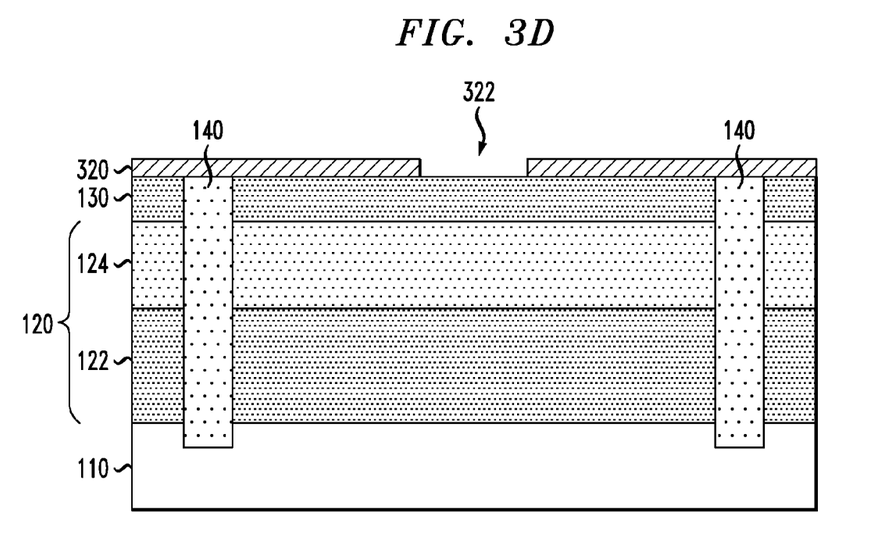
FIG. 3D is a cross-sectional view of the structure of FIG. 3C after patterning the layer of dielectric material using the photoresist mask to form an etch mask, according to an embodiment of the invention.

FIG. 3D is a cross-sectional view of the structure of FIG. 3C after patterning the layer of dielectric material 300 with the photoresist mask 310 to form an etch mask 320 (e.g., nitride etch mask), according to an exemplary embodiment of the invention. The etch mask 320 comprises an opening 322 which corresponds to the opening 312 of the photoresist mask 310. The etch process may be performed by etching the dielectric layer 300 using an anisotropic etch process with an etching chemistry that is suitable to etch the dielectric layer 300. After forming the etch mask 320, the photoresist mask 310 is removed using known techniques, resulting in the structure shown in FIG. 3D.

Figure 3E:
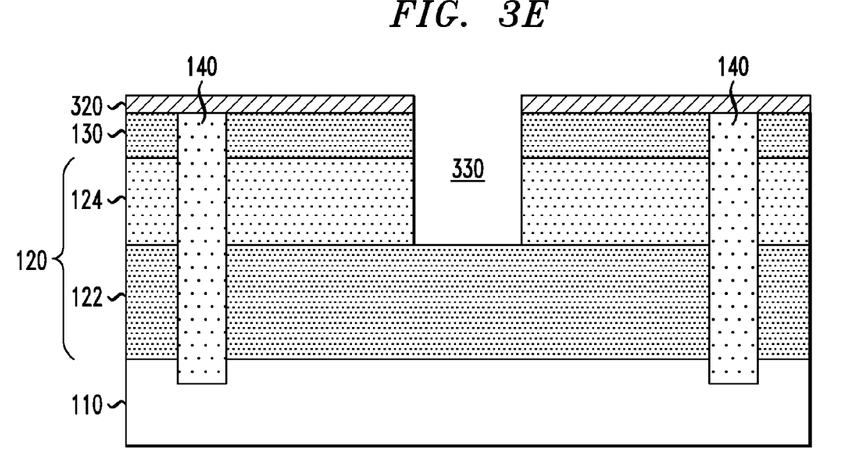
FIG. 3E is a cross-sectional view of the structure of FIG. 3D after performing an etch process using the etch ask to form a recess region through the channel layer into the buffer layer, according to an embodiment of the invention.

A next step in the fabrication process includes using the etch mask 320 to etch a recess through the channel layer 130 into the buffer layer 120. For example, FIG. 3E is a cross-sectional view of the structure of FIG. 3D after performing an etch process using the etch mask 320 to etch a recess through the channel layer 130 and in the buffer layer 120 down to the first buffer layer 122, according to an embodiment of the invention. The etch process may be performed by sequentially etching the layers 130 and 124 using a sequence of one or more anisotropic etch processes with etching chemistries that are suitable to etch the semiconductor materials forming the layers 130 and 124. The etch process results in the formation of a recess region 330, wherein the recess region 330 serves as an opening to selective etch the first buffer layer 122 to form a resistor region. In addition, the recess region 330 defines the region in which a contact plug is formed.

Figure 3F:
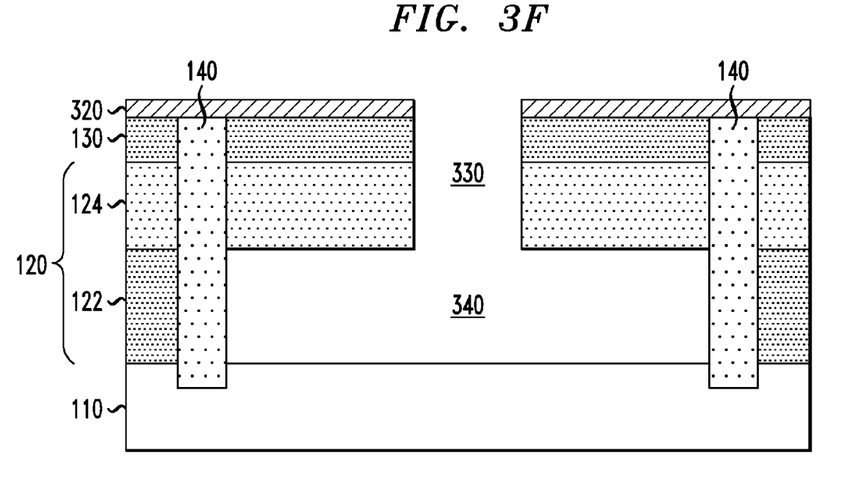
FIG. 3F is a cross-sectional view of the structure of FIG. 3E after performing a selective etch process to selectively etch away a portion of the buffer layer and form a resistor region in the buffer layer, according to an embodiment of the invention.

FIG. 3F is a cross-sectional view of the structure of FIG. 3E after performing a selective etch process to selectively etch away a portion of the buffer layer 120 and form a resistor region 340 in the buffer layer 120, according to an embodiment of the invention. More specifically, as shown in FIG. 3F, an etch process is performed to selectively etch away a portion of the first buffer layer 122 which is beneath the second buffer layer 124 and within the confines of the trench isolation structure 140. In one embodiment, the etch process can be implemented using a wet etch process (or other suitable isotropic etch process) to selectively etch away the first buffer layer 122 selective to the other layers 110, 124, and 130 and thereby undercut the first buffer layer 122 below the second buffer layer 124 to form a void in the first buffer layer 122 which defines a resistor region 340.

With this selective etch process, the trench isolation structure 140 serves as an etch stop which defines the outer boundary of the resistor region 340. In this regard, the etch process for etching the first buffer layer 122 is also selective to the trench fill material of the trench isolation structure 140 so that the resistor region 340 is self-aligned to the inner sidewalls of the trench isolation structure 140. In this embodiment, etching the first buffer layer 122 selective to the second buffer layer 124, the substrate 110, and the trench isolation structure 140 enables the formation of the resistor region 340 with precise dimensions.

Figure 3G:
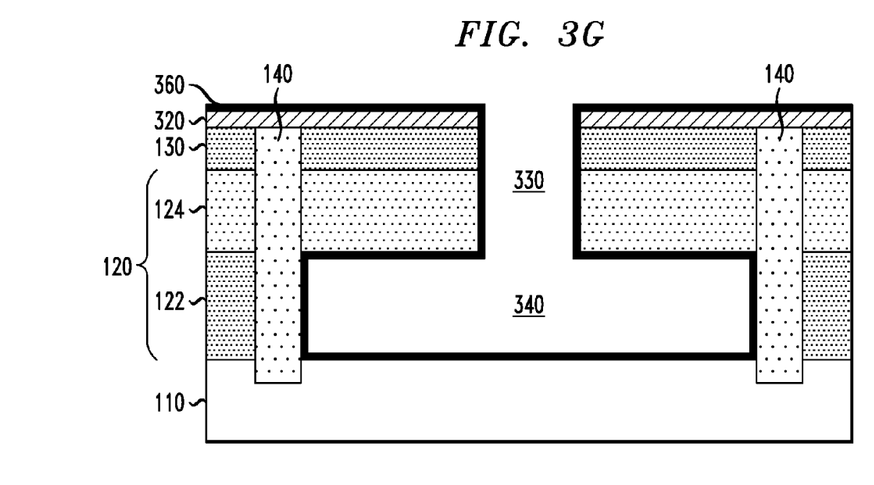
FIG. 3G is a cross-sectional view of the structure of FIG. 3F after depositing a layer of dielectric material on exposed surfaces of the semiconductor structure, according to an embodiment of the invention.

A next step in the fabrication process includes depositing a layer of dielectric material to coat the exposed surfaces of the semiconductor structure. For example, FIG. 3G is a cross-sectional view of the semiconductor structure of FIG. 3F after depositing a layer of dielectric material 360 to conformally coat the exposed surfaces of the semiconductor structure. The portion of the dielectric material 360 on the exposed surfaces of the channel layer 130 and buffer layer 120 within the recess region 330 and the resistor region 340 forms the insulating layer 160 (FIG. 1B). In alternate embodiments of the invention, the layer of dielectric material 360 may comprise an oxide material or a nitride material that is deposited using known techniques (e.g., CVD). In one embodiment, the layer of dielectric material 360 is formed with a thickness in a range of about 10 nm to about 50 nm. The layer of dielectric material 360 may be formed with any material and thickness which, as noted above, is sufficient for the insulating layer 160 to serve as a barrier diffusion layer and a thermal insulating layer for the buried resistors within the buffer layer 120.

Figure 3H:
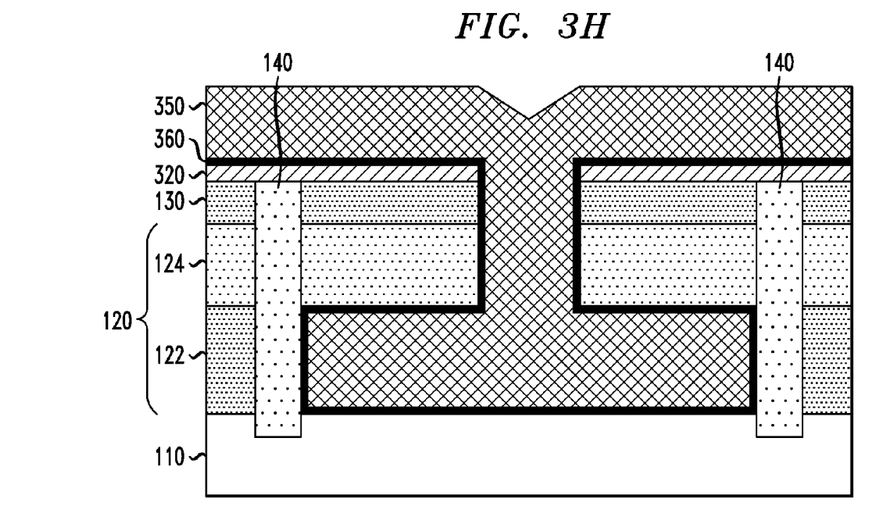
FIG. 3H is a cross-sectional view of the structure of FIG. 3G after depositing a semiconductor resistor material to fill the recess region and resistor region within the buffer layer, according to an embodiment of the invention.

The fabrication process proceeds by depositing a layer of semiconductor resistor material to form a buried resistor. For example, FIG. 3H is a cross-sectional view of the structure of FIG. 3G after depositing a layer of semiconductor resistor material 350 to fill the recess region 330 and the resistor region 340 within the buffer layer 120, according to an embodiment of the invention. In one embodiment of the invention, the semiconductor resistor material 350 comprises amorphous silicon or polysilicon, or any other material which is suitable to form a buried resistor. The semiconductor resistor material 350 may be doped (e.g., B-doped Si) to achieve a target resistivity of the resistor material. The semiconductor resistor material 350 may be deposited using known techniques.

Figure 3I:
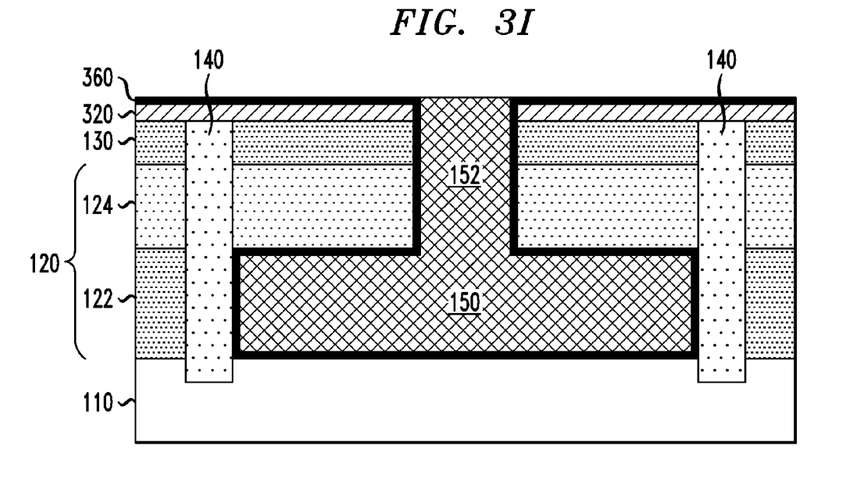
FIG. 3I is a cross-sectional view of the structure of FIG. 3H after removing a portion of the semiconductor resistor material on a surface of the semiconductor structure, according to an embodiment of the invention.

A next step in the fabrication process includes sequentially performing one or more etch processes to remove the portions of the semiconductor resistor material 350, the dielectric layer material 360, and the etch mask 320 down to the channel layer 130. For example, FIG. 3I is a cross-sectional view of the structure of FIG. 3H after removing a portion of the semiconductor resistor material 350 on the upper surface of the semiconductor structure, according to an embodiment of the invention. In one embodiment of the invention, a CMP (chemical mechanical planarization) process can be used to remove the semiconductor resistor material 350 down to the layer of dielectric material 360, while planarizing the surface of the semiconductor structure. As shown in FIG. 3I, after completion of the CMP etch, the remaining portion of the semiconductor resistor material 350 forms the contact plug 152 and the buried semiconductor resistor 150.

Figure 3J:
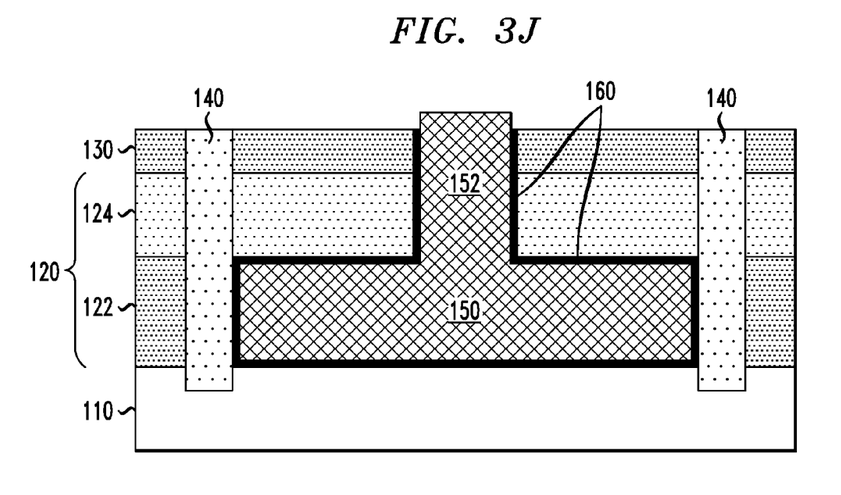
FIG. 3J is a cross-sectional view of the structure of FIG. 3I after etching away the layer of dielectric material and the etch mask on the surface of the semiconductor structure down to the channel layer, according to an embodiment of the invention.

In addition, FIG. 3J is a cross-sectional view of the structure of FIG. 3I after sequentially etching away the portion of the dielectric layer 360 and the etch mask 320 on the surface of the semiconductor structure down to the channel layer 130, according to an embodiment of the invention. The portion of the dielectric layer 360 on the surface of the semiconductor structure can be removed using an anisotropic RIE or wet etch with a suitable etch chemistry. In addition, the etch mask 320 can be removed using an anisotropic RIE or wet etch with a suitable etch chemistry. As shown in FIG. 3J, the remaining portion of the dielectric layer 360 on the inner walls of the recess region 330 and the resistor region 340 forms the insulting layer 160.

Thereafter, a sequence of FEOL (front end of line) semiconductor fabrication process steps can be performed to build active or passive components on the active surface of the semiconductor structure, followed by a sequence of BEOL (back end of line) semiconductor fabrication process steps to interconnect the various active and passive components on the active surface of the semiconductor structure.

For example, as part of the FEOL processing, a silicide or metallization process can be can performed on the structure shown in FIG. 3J to form ohmic contacts 170, resulting in the structure shown in FIG. 1B, for example. For example, the ohmic contacts 170 can be silicide contacts that are formed using well-known techniques. For instance, a metal layer can be formed on the exposed surface of the contact plugs 152. The metal layer may be formed by depositing a rare earth metal material such as Er (erbium), Yb (ytterbium), or other lanthanide metals such as Ds, Lu, Gd, Tb, Ho, etc. The metal material may be deposited using evaporation or sputtering methods, or other known methods such as CVD and ALD (atomic layer deposition), and having a thickness in a range of about 2 nm to about 50 nm. The silicide contacts are then formed by heating the semiconductor wafer to allow portion of the metal layer to react with the underlying semiconductor resistor material (e.g., polysilicon) to form low-resistance metal silicide contacts. In one exemplary embodiment, the silicide process is performed by furnace annealing or rapid thermal annealing, at a suitable temperature for a suitable amount of time. Thereafter, any remaining portion of the metal layer is removed by, e.g., a chemical etching process, leaving silicide ohmic contacts 170 for the buried resistors.

In another embodiment, the ohmic contacts 170 may be metallic contacts that are formed by depositing and etching one or more layers of metallic material on the semiconductor structure so that a layer of metallic material remains on the exposed surfaces of the contact plugs 152. The metallic material may comprise one or more types of metal material such as palladium, aluminum, titanium, tungsten, titanium, gold, silver, molybdenum, nickel, rhodium, niobium, and/or combinations thereof.

It is to be understood that the methods discussed herein for fabricating buried resistors in buffer layers can be incorporated within semiconductor processing flows for fabricating various types of integrated circuits with various analog and digital circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
    a semiconductor substrate;
    a buffer layer disposed on the semiconductor substrate, wherein the buffer layer comprises a first buffer layer and a second buffer layer, wherein the first buffer layer comprises a first layer of epitaxial compound semiconductor material that is epitaxially grown on the semiconductor substrate, wherein the second buffer layer comprises a second layer of epitaxial compound semiconductor material that is epitaxially grown on the first buffer layer, wherein the first and second layers of epitaxial compound semiconductor material are formed of different compositions of compound semiconductor material;
    an active device layer disposed on the buffer layer, wherein the active device layer comprises a layer of epitaxial semiconductor material that is epitaxially grown on the buffer layer;
    a contact plug disposed within a contact opening formed in the second buffer layer; and
    a buried resistor disposed within a cavity formed within the first buffer layer below the second buffer layer and the active device layer, wherein a portion of the cavity within the first buffer layer comprises an undercut region which undercuts a portion of the second buffer layer surrounding the contact plug within the contact opening formed in the second buffer layer such that a portion of the buried resistor within the undercut region of the cavity is disposed underneath a bottom surface of the second buffer layer;
    wherein the contact plug is connected to the buried resistor;
    wherein the buffer layer serves to match a lattice constant of the semiconductor substrate to a lattice constant of the layer of epitaxial semiconductor material of the active device layer.

2. The device of claim 1, wherein the contact plug and the buried resistor are formed of a same material.

3. The device of claim 1, further comprising an ohmic contact formed on a surface of the contact plug exposed through the active device layer.

4. The device of claim 1, further comprising a trench isolation structure formed within the active device layer and the buffer layer to define a resistor region for the buried resistor.

5. The device of claim 1, wherein the layer of epitaxial semiconductor material of the active device layer comprises a third layer of epitaxial compound semiconductor material which is different in composition from the first and second layers of epitaxial compound semiconductor material.

6. The device of claim 5, wherein the first, second, and third layers of epitaxial compound semiconductor material are formed of III-V compound semiconductor materials.

7. The device of claim 1, further comprising an insulating liner disposed between the buried resistor and the buffer layer.

8. A semiconductor integrated circuit chip comprising the semiconductor device of claim 1.

9. The device of claim 1, wherein the buried resistor comprises polysilicon.

10. The device of claim 1, wherein the semiconductor substrate comprises silicon.

11. The device of claim 1, wherein the semiconductor substrate comprises III-V compound semiconductor material.

12. The device of claim 1, wherein the buried resistor comprises a straight elongated profile.

13. The device of claim 1, wherein the buried resistor comprises a meandering profile.

14. The device of claim 1, wherein the active device layer is epitaxially grown on the second buffer layer.

* * * * *